United States Patent [19]
Lin

[11] Patent Number: 5,571,560
[45] Date of Patent: Nov. 5, 1996

[54] PROXIMITY-DISPENSING HIGH-THROUGHPUT LOW-CONSUMPTION RESIST COATING DEVICE

[76] Inventor: Burn J. Lin, 4603 Bayshore Blvd., Tampa, Fla. 33611

[21] Appl. No.: 180,368

[22] Filed: Jan. 12, 1994

[51] Int. Cl.⁶ .................... B05D 3/12; B05C 11/02
[52] U.S. Cl. ............ 427/240; 427/335; 427/377; 427/385.5; 427/422; 427/425; 118/52; 118/64; 118/305; 118/313; 118/314; 118/320
[58] Field of Search ................ 427/240, 385.5, 427/377, 422, 425, 335; 118/52, 64, 305, 313, 314, 320

[56] References Cited

U.S. PATENT DOCUMENTS

| | | | |
|---|---|---|---|
| 4,347,302 | 8/1982 | Gotman | 430/270 |
| 4,416,213 | 11/1983 | Sakiya | 118/302 |
| 5,013,586 | 5/1991 | Cavazza | 427/240 |
| 5,095,848 | 3/1992 | Ikeno | 118/53 |
| 5,254,367 | 10/1993 | Matsomura et al. | 427/240 |
| 5,366,757 | 11/1994 | Lin | 427/9 |
| 5,378,511 | 1/1995 | Cardinali et al. | 427/240 |

Primary Examiner—Janyce Bell
Attorney, Agent, or Firm—Langen & Langen, P.A.

[57] ABSTRACT

A minimal amount of waste in liquid resist material is achieved by dispensing through small openings at close proximity to the substrate. An airtight substrate chamber as well as airtight sealing of dispensing assembly and airtight sealing of the space that does not have to be opened for substrate loading and unloading, are used to facilitate a uniform and planarized coating after a high-speed spin off of excess resist.

12 Claims, 6 Drawing Sheets

PROXIMITY-DISPENSING HIGH-THROUGHPUT LOW-CONSUMPTION RESIST COATING DEVICE

BACKGROUND OF THE INVENTION

1. Field of the Invention

This invention relates to apparatus for coating a soluble coating material upon a substrate, and more specifically to achieve high throughput, high uniformity, and small quantity of the soluble material used.

2. Description of Related Art

Photoresist, or resist henceforth, is usually deposited to a substrate, or more particularly a wafer, by means of forming a puddle followed by spinning. A large puddle of resist covering more than half of the substrate area is applied via a dispenser that directs a steady flow of resist in liquid form. The thickness of the puddle is of the order of a millimeter. The substrate is then spun at a speed ranging from 1,000 to 10,000 rpm to thoroughly spread out and remove the excess resist to result in a film thickness on the order on between a fraction of micrometer and a few micrometers. Therefore, only a small percentage of the resist material actually remains on the substrate. Most of the resist material dispensed is wasted, resulting in high cost and waste disposal problems.

U.S. Pat. No. 3,695,911 of Jerry Polin et al for "Method for Applying a Flowable Substance to a Workpiece", Oct. 3, 1972, teaches depositing a quantity of the liquid substance on the surface of the substrate while the substrate is at rest, and then rapidly rotating the substrate at a high rate of acceleration to form a layer of uniform thickness. This prior art does not teach depositing and spinning in a solvent-vapor-rich environment. Without it, a large amount of liquid substance is required to wet a large area on the substrate to prevent the onset of drying which produces film non-uniformity.

U.S. Pat. No. 4,640,846 of Yue Kuo for "Semiconductor Spin Coating Method", Feb. 3, 1987, mentions depositing the liquid resist material semi-uniformly by spraying or other methods. The spinning does not take place in a solvent-vapor-rich environment. Therefore, the specific thin-coating capability of spray coating is not exploited. That is, even if a thin semi-uniform pre-spin coating were made by spraying, a non-uniform finished coating results because of partial drying of the liquid before and during spin, when a solvent-vapor-rich environment is not provided. Spraying a sufficiently thick layer, as required by this invention to keep the liquid from drying, results in wasting the liquid material.

U.S. Pat. No. 4,290,384 of Ausschnitt et al for "Coating Apparatus", Sep. 22, 1981, attempts to reduce material consumption by converting the coating material to a mist by means of an ultrasonic nebulizer and transported by a carrier gas to a chamber which contains a stationary substrate. The mist is allowed to settle onto the substrate under the force of gravity. Spin coating is not used. The final thickness and its uniformity are extremely sensitive to the liquid temperature, ultrasonic drive power, concentration of the liquid, and the volume delivered; thus difficult to control.

U.S. Pat. No. 4,347,302 of Alexander Gotman for "Process for Applying a Thin Coating in Liquid Form and Subsequently Drying It", Aug. 31, 1982, teaches the planarizing advantage of spinning in a solvent-vapor-rich environment. The substrate is moved into a large vapor chamber in an airtight substrate carrier which is essentially a smaller vapor chamber. Then, the carrier is opened to expose the top of the substrate to receive the liquid resist material and to spin it off to achieve the desired thickness and uniformity. After spinning, the substrate is moved to a vapor-free area and a baking station in the same airtight substrate carrier. Spray depositing is not used. Hence, material consumption is not reduced. Another disadvantage is that the substrate carrier is complicated. In addition, it requires mechanical clamping instead of vacuum clamping to fasten the substrate to the substrate stage, which, subjects the substrate to a high probability of defects and damage. Furthermore, transporting the carrying chamber is wasteful in space and processing time.

U.S. Pat. No. 5,094884 of Hillman and Mohondro for "Method and Apparatus for Applying a Layer of a Fluid Material on a Semiconductor Substrate." Teaches using a nozzle to produce a rectangular or oblong liquid dispensing pattern. Neither spraying nor a solvent-vapor-rich environment is used. Reduction of material consumption cannot be achieved.

U.S. patent application Ser. No. 07/784,290 filed Oct. 29, 1991 of Cardinali and Lin for "A Material Saving Resist Spinner and Process" describes saving resist by spray coating a thin layer of resist on the substrate which is kept in a solvent-vapor-rich environment followed with spinning in the same environment. This prevents the resist from drying so that the spin-off can produce a uniform coating even though the starting thickness is only slightly larger than the final thickness. In addition to the spray-coating and solvent-vapor-rich requirements, another key requirement of the prior invention is a delay between spray coating and spinning to permit the resist to reflow evenly, without which a uniform coating cannot be achieved. The delay or spread-out time is on the order of 30 seconds. It significantly reduces throughput.

U.S. patent application Ser. No. 08/100,311 filed Aug. 2, 1993 of Lin for "A high-throughput low-consumption resist coating device" teaches small-particle, low-velocity spraying, temperature regulations, and vapor evacuation control to increase the throughput and uniformity of the spray-and-spin-in-vapor technique. The resist material is delivered to the substrate surface by means of small-particle, low-velocity spraying in the presence of a rich vapor.

SUMMARY OF THE INVENTION

According to proximity dispensing of this invention, the delivery of a thin layer of resist material is not accomplished by spraying but by dispensing the liquid resist in the form of streams, via small openings placed slightly above the substrate. The location, size, and distribution of the openings are optimized to produce a thin coating quickly and without requiring a homogenizing delay between spraying and spinning. Throughput is significantly enhanced.

Further according to this invention, the liquid resist dispensing apparatus can be smoothly imbedded with its background or covered with a surface-smoothening plate during the excess- material-removing high-speed spin-off to prevent air turbulence which reduces the uniformity of the finished coating.

Also according to this invention, the proximity of the smooth surface above the substrate facilitates rapid saturation of solvent vapor to enhance throughput.

Further according to this invention, solvent vapor is retained in compartments above and/or below the substrate when the substrate chamber is opened for loading and unloading of the substrate further reducing the time to build up a rich vapor and subsequently further enhances throughput. It also effectively reuses the vapor to reduce the amount of vapor to be exhausted, hereby wasted, during substrate loading and unloading.

Yet another feature of this invention is to provide a resist reservoir within the coating chamber to keep the resist at the same temperature as the spinning environment, improving the consistency and uniformity of the coating.

BRIEF DESCRIPTION OF THE DRAWINGS

The foregoing and other aspects and advantages of this invention are explained and described below with reference to the accompanying drawings, in which:

FIG. 2b is a top view of an alternative embodiment of the dispensing arms depicted in FIG. 2a;

FIG. 2c depicts alternative shapes for the individual dispensing nozzles of the dispensing arm;

FIG. 3 is a schematic depicting the mathematical relationship between nozzle location and nozzle size along the dispensing arm;

FIG. 4b is a sectional view taken along line 4b—4b of FIG. 4a;

FIG. 5b is a sectional view of a spin chamber taken along line 5b—5b of FIG. 5 a;

DESCRIPTION OF THE PREFERRED EMBODIMENT

In a typical resist spin coating process, the residual presence of solvent vapor is insufficient to prevent the resist from starting to dry at the air-to-resist surface as soon as it is deposited on the substrate 58. The drier layer on top is the cause of a non-uniform coating during spin off of the excess resist. This is prevented by using a thick puddle to ensure a sufficient amount of wet substance to spin off. However, too much material is required. A very thin layer of resist can be dispensed on the substrate 58 to save resist material provided that a rich solvent vapor is present during resist depositing and resist spinning to prevent drying until a uniform coating is achieved. Reference is hereby made to prior application Ser. Nos. 07/784,290 and 08/100,311, described above, and the same and any resulting patents are hereby incorporated into this disclosure by reference.

Figure 1A:
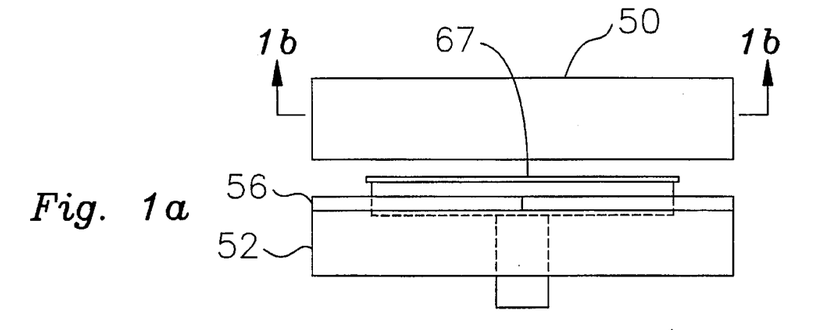
FIG. 1a is a side elevation of a spin chamber according to the present invention.

FIG. 1a–1g show a proximity liquid-dispensing apparatus using a pivoted dispensing arm. In FIG. 1a which is the view from substrate 58 towards substrate chamber cover 50, the dispensing arm 66 consists of densely populated nozzles 64 whose diameter is a function of the radial distance from the center 67 of substrate 58 rotation. The nozzles 64 that are farther away from the center of the wafer substrate 58 are larger in size so that more liquid resist is dispensed at the outer areas of the substrate 58 which move faster than the inner part of the substrate 58. The dispensing arm has a curvature similar to that of the circumference of the cover 50 of the substrate chamber, generally indicated as 53, so that after dispensing the resist, it fits into the dispensing arm parking slot 70 built into a side of the substrate spin chamber 53. The two edges of the dispensing arm parking slot 70, being the inner edge 71 and the outer edge 77, show the extent of parking slot 70. Once the dispensing arm 66 is parked inside the slot 70, the slot 70 is closed and maintained in a vapor rich environment so that the resist at the nozzles 64 cannot dry out while the cover 50 of the substrate chamber 53 is opened for substrate loading and unloading. Resist retaining trench 72 provides the vapor and is in fluid communication with substrate 58. When the dispensing arm 66 is parked, it seals the parking slot 70 to desired vapor. In addition, the protruding arm 66 is hidden in the parking slot 70 to free the substrate chamber 53 from turbulence-inducing airflow obstructions during the excess-resist-removal and resist-uniformizing high-speed spin.

Figure 1B:
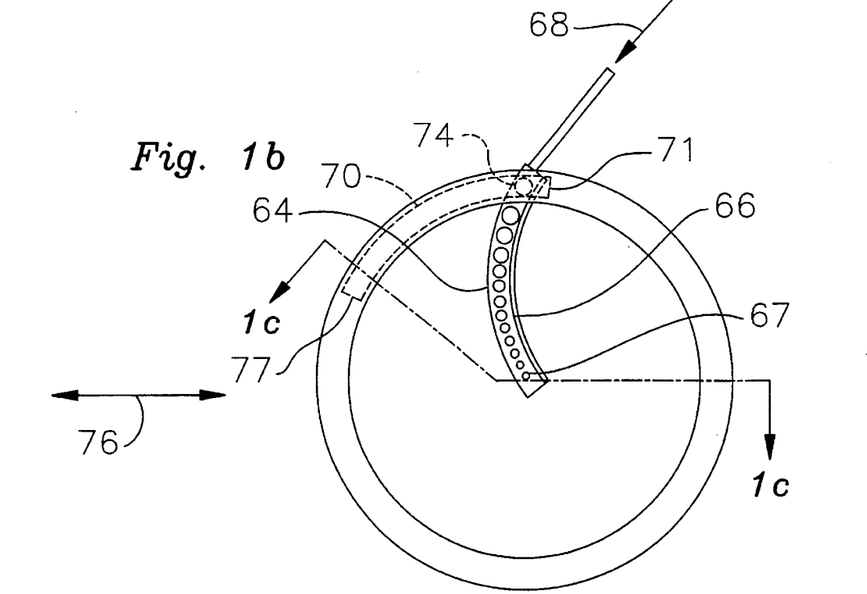
FIG. 1b is a sectional view of a spin chamber taken along line 1b—1b of FIG. 1a showing a dispensing arm and a parking slot.

An additional step to dispense a small amount of resist into trench 72 can be performed whenever the nozzles 64 need flushing or trench 72 has to be replenished with liquid resist. A vapor sensor 78 can be used to activate this dispensing step when the vapor inside the parking slot 70 drops below a predetermined threshold.

Dispense arm 66 can be lowered to prepare for resist dispense to achieve a close proximity to the substrate 58 and can be raised while moving in and out of the parking position to facilitate fast turning. Conversely, the substrate chuck 60 can be raised instead.

A regulated resist supply 68 may conveniently be provided by a well known pump and in-line flowmeter arrangement or a cylinder-piston arrangement using a resist reservoir outside the substrate chamber 53. The pump may be turned off after the desired amount of resist has passed through the flowmeter. The piston may travels a predetermined distance to dispense a desirable amount of liquid.

Figures 1C, 1D:
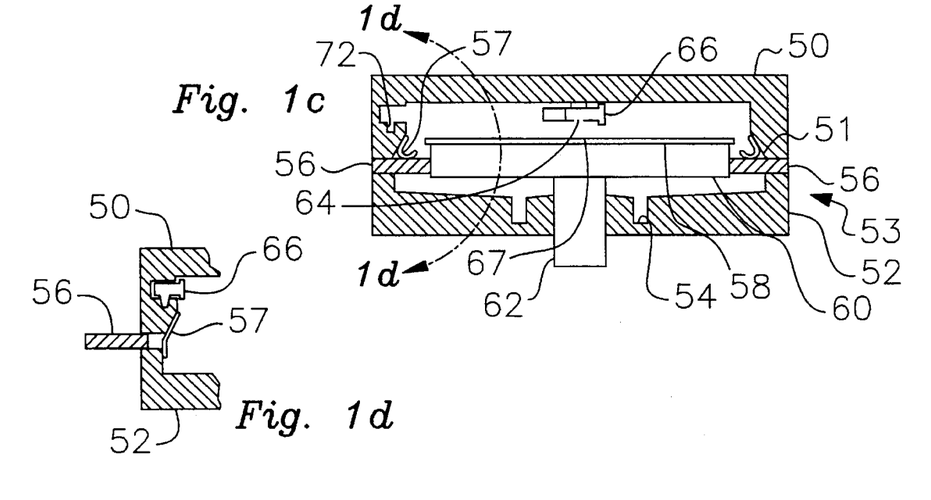
FIG. 1c is a sectional view of a spin chamber taken along line 1c—1c of FIG. 1b showing a substrate wafer, a substrate chuck, and the parking slot.
FIG. 1d is a fragmentary sectional view taken along line 1d—1d of FIG. 1c showing the dispensing arm in its parked position.

In FIG. 1c, the crossection view taken along line 1c—1c of FIG. 1b, the bottom part 52 of the substrate chamber 53 contains resist collecting trench 54. Prior to high-speed spinning, vapor-sealing ring sections 56 move outwards, thus, opening the space between the substrate 58 and the bottom part 52 of the substrate chamber. Excess resist spun off the substrate 58 is deflected by the flexible cover 57 attached to the slanted sidewall 51, as shown in FIG. 1d. After the desired resist thickness and uniformity is achieved, high-speed spinning is stopped. Ring sections 56 are moved in to seal the vapor in the lower part 52 of the substrate chamber 53. The substrate chamber cover 50 is then raised as shown in FIG. 1a the outside view from the substrate loading and unloading direction 76. This direction is chosen as an example and is not the only possible direction along which the substrate 58 can be loaded and unloaded.

Figure 1E:
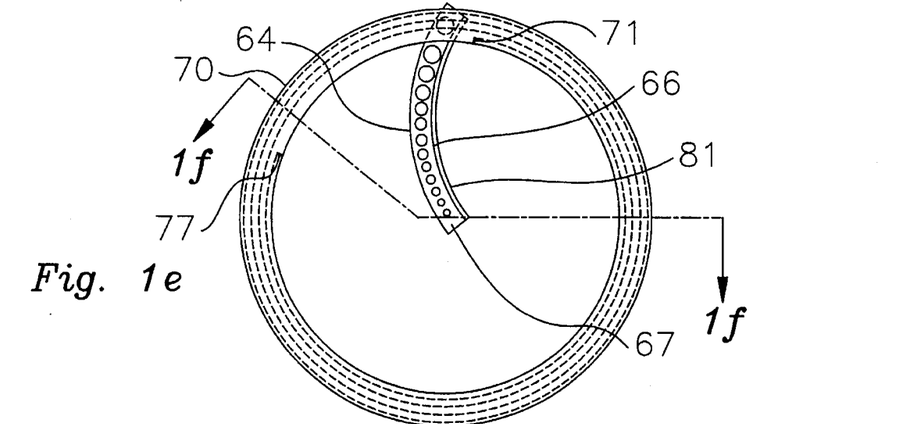
FIG. 1e is a sectional view of an alternative embodiment of the parking lot depicted in FIG. 1b.
Figure 1F:
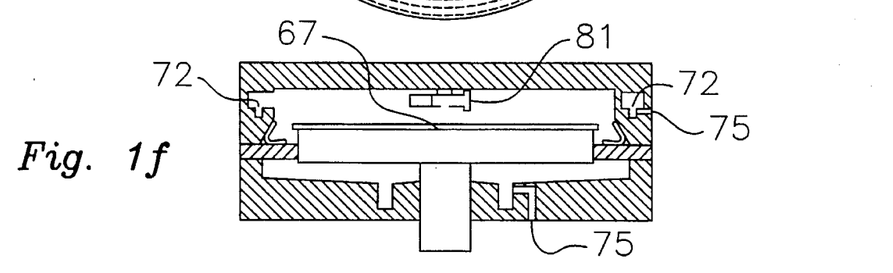
FIG. 1f is a side sectional view of the alternative embodiment of FIG. 1e taken along line 1f—1f of FIG. 1e.

The entire periphery of substrate chamber cover 50 can be used as the vapor containing space of parking slot 70 as shown in FIGS. 1e and 1f. This provides a larger vapor-rich volume to quickly fill the dispense area with vapor once the parking slot cover 81 is opened. The parking slot 70 remains open between edges 71 and 77 so that the extra rim on the dispense arm 66 retains its function as the cover 81 for the parking slot 70 just as in the case of FIG. 1a and 1b.

Figure 1G:
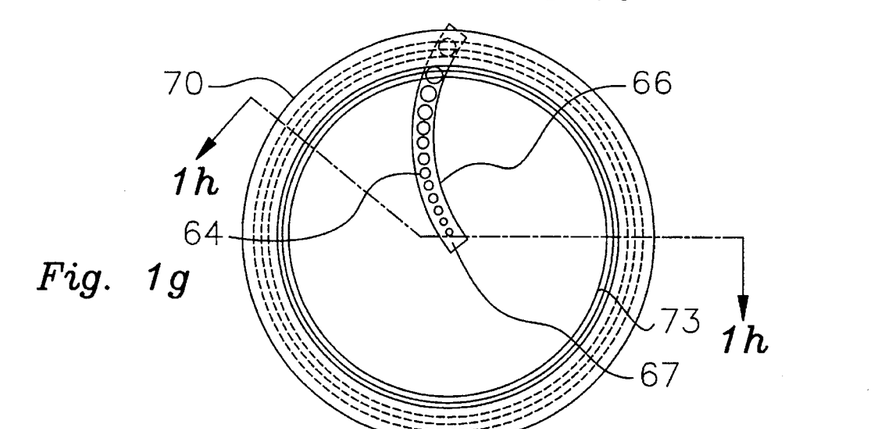
FIG. 1g is a sectional view of an alternative embodiment of the spin chamber incorporating a parking slot depicted in FIG. 1e.
Figure 1H:
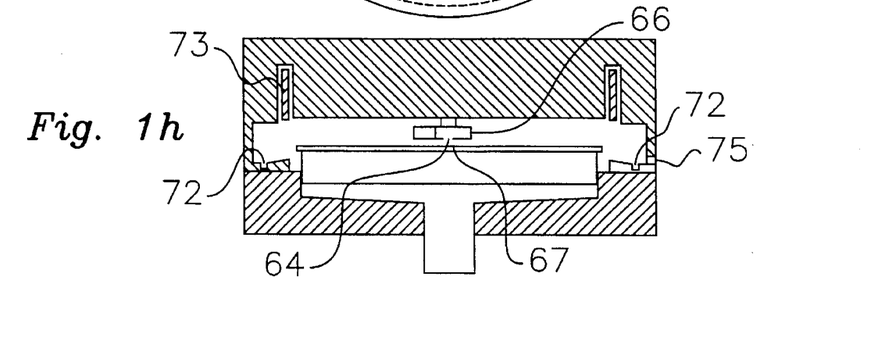
FIG. 1h is a sectional view taken along 1h—1h of FIG. 1g.

Instead of collecting the excess resist at the bottom 52 of the substrate chamber 53, the vapor chamber formed by the parking slot 70 can be used to collect the excess resist as shown in FIGS. 1g and 1h. A circular door 73 covers the entire vapor chamber 53 before the substrate chamber cover 50 is raised for wafer 58 loading and unloading. Well known resist discharge means 75 shown in FIGS. 1f and 1h prevents overcollection of resist in the vapor chamber 53.

Figure 2A:
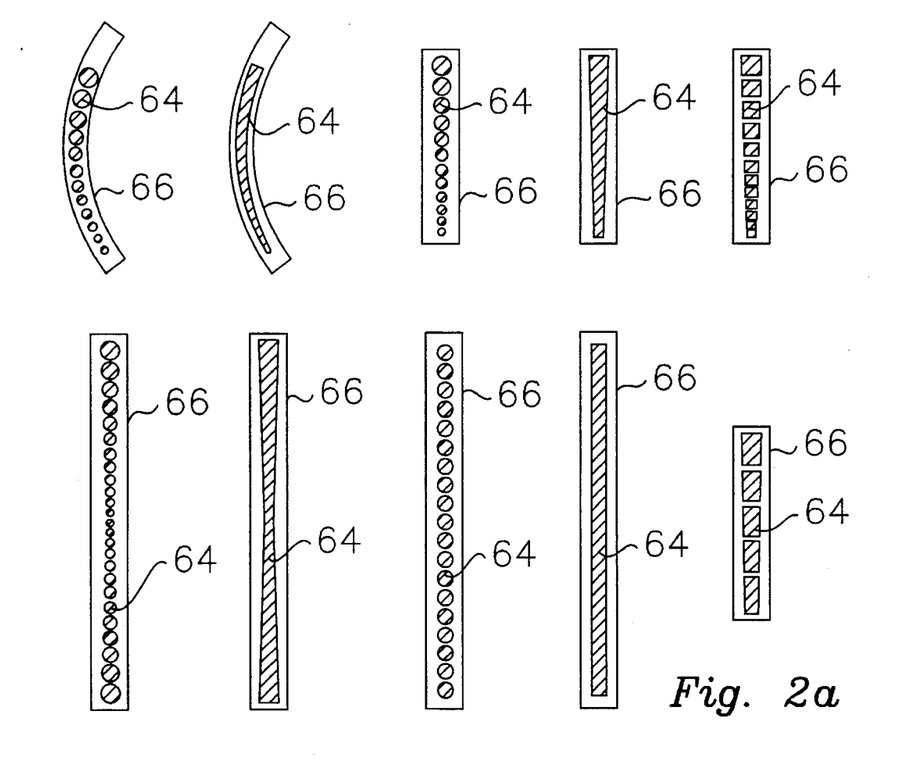
FIG. 2a shows top views of various alternative embodiments of the dispensing arm depicted in FIG. 1b taken along line 2a—2a of FIG. 1b.
Figures 2B, 2C, 3:
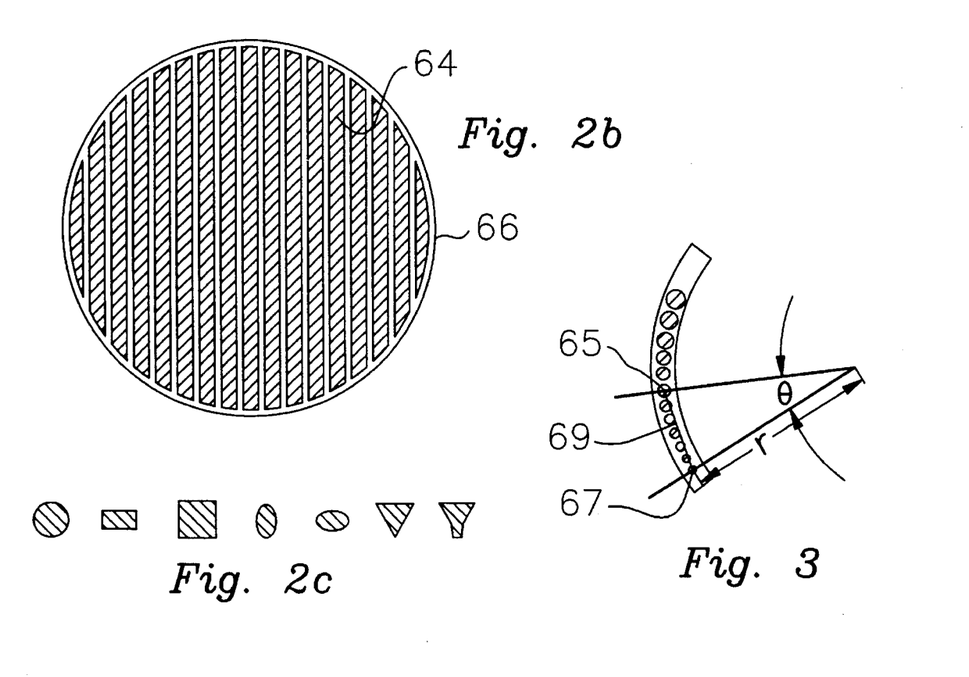

FIG. 2a shows that the nozzles 64 can take many shapes. A continuous wedge opening or a constant-width narrow slit opening may also be used. FIGS. 2a and 2b show that the arm 66 can cover a small area, a short line, the full diameter, or the full area of the substrate 24. FIG. 2c shows possible crossections of the dispensing arm 66. FIG. 3 shows the relation that leads to an estimate of the hole size in the case of a curved dispensing. The size of the nozzle 64 opening is, to the first order, proportional to the radial distance 69 between the center point 67 and a arbitrary dispensing point 65. Distance 69 is equal to 2r Sinθ/2, where r is the radius of curvature of the dispensing arm and θ the angular distance between nozzles 65 and 67. When the hole 64 size becomes impractically small, the smallest practical size is used instead.

Figure 4A:
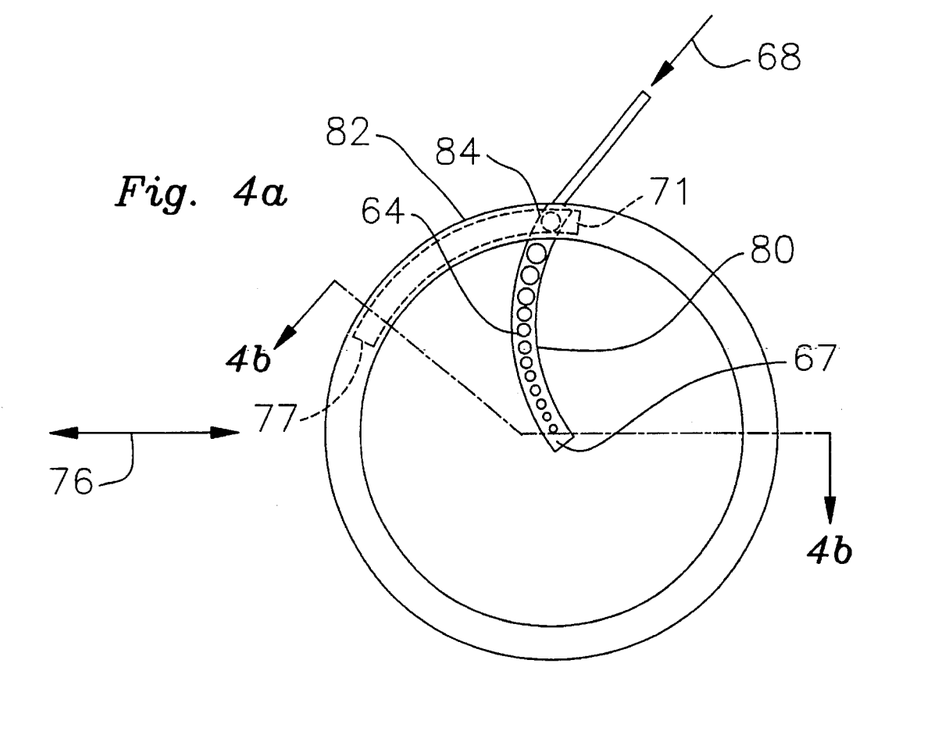
FIG. 4a an alternative embodiment of the sectional view of a spin chamber of FIG. 1b.
Figure 4B:
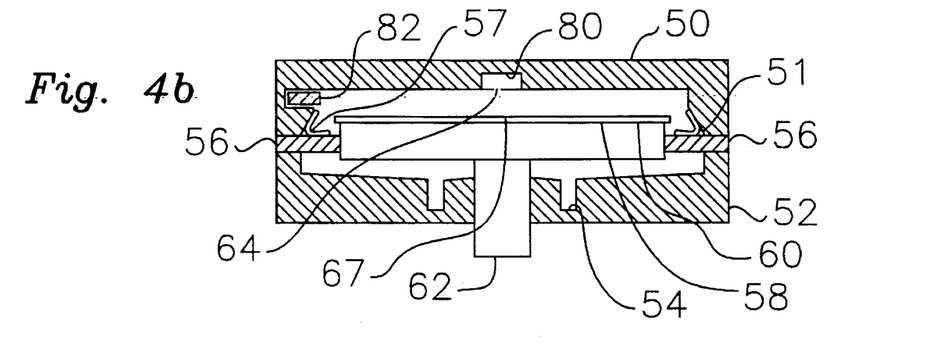

FIG. 4a and 4b show another embodiment of the apparatus for proximity liquid dispensig according to the present invention. Here, instead of a retractable dispensing arm 66, the dispense nozzles 64 are built into the substrate chamber cover 50 to result in a smooth, aerodynamically non-turbulent during substrate spinning, surface. After high-speed spinning, nozzle cover 82 moves over to cover the nozzles 64 before substrate chamber cover 50 is raised.

Figure 4C:
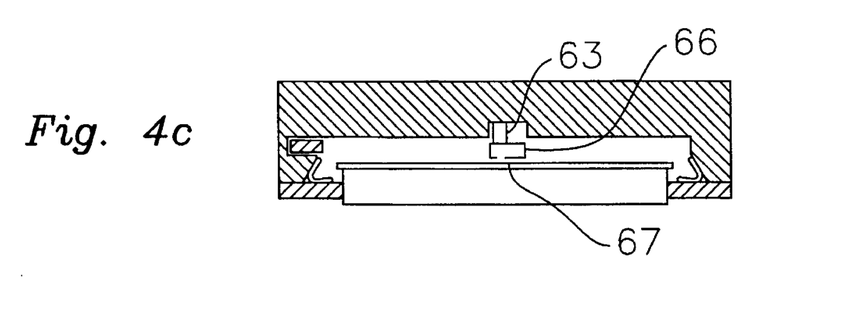
FIG. 4c is a sectional view similar to FIG. 4b depicting a lowered dispensing arm.

FIG. 4c shows an embodiment that combines a dispensing arm 66 of FIG. 1b and a nozzle cover 82 of FIGS. 4a and 4b. The dispensing arm 66 can be lowered to a close proximity of the substrate 58 for liquid resist dispensing. Before high-speed spinning, dispense arm 66 is lifted by the retractable support 63 resulting in a smooth surface. Conversely, the substrate chuck 60 can be raised instead. After high-speed spinning, nozzle plate cover 82 moves in to cover the nozzles 64 the dispense arm in the retracted position. The resist in the nozzles 64 is now protected against drying and the chamber cover 50 can be raised after the bottom area 52 is protected by moving in the shielding ring sections 56.

Figure 5A:
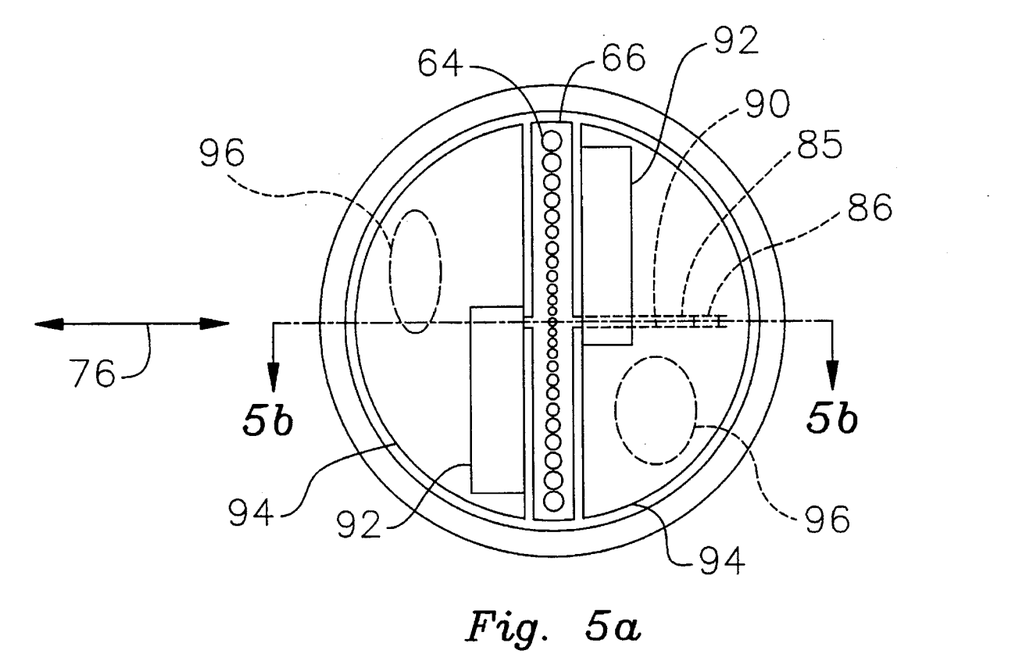
FIG. 5a is a sectional view of an alternative embodiment of the spin chamber and dispensing arm of FIG. 1b.
Figure 5B:
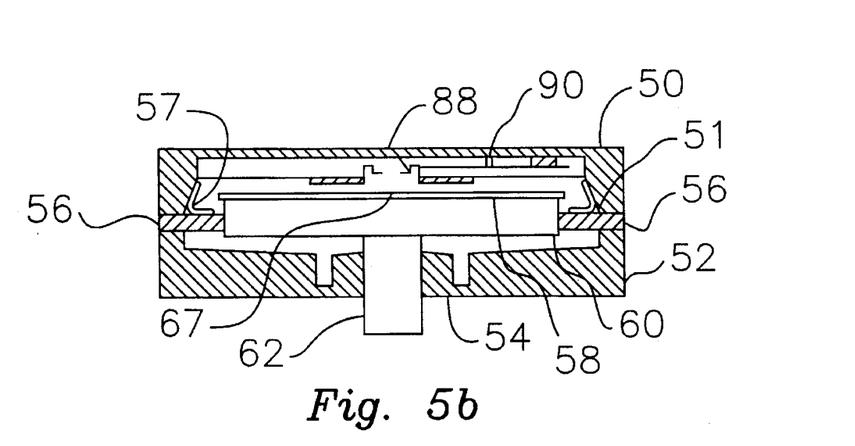

FIG. 5 shows yet another embodiment of proximity dispense. The dispensing nozzles 64 are distributed on a straight line through the entire diameter of the wafer 58. Resist reservoirs 94 are built into the substrate chamber cover 50. Cylinder 85 is embedded in one of the reservoirs 94. Piston 86 is pushed through a controlled distance to dispense the desired amount of liquid resist. Valve 88 allows the resist to flow to the dispense nozzles but not in the reverse direction, so that after piston 86 reaches the end of its travel, it can be retracted to draw more resist into the cylinder 85 through hole 90. Valve 88 can be placed at hole 90 or any other location between the piston 86 and the dispense nozzles 64. Balloons 96 or bellows 96 are filled with more inert liquid when resist is drawn into the cylinder 85 to compensate for the reduction of resist volume in the reservoir 94. These balloons 96 are properly valved using well known means so that they cannot contract when the piston 86 is pushing resist through the nozzles 64. Otherwise, resist moves out of the cylinder 85 through hole 90. Nozzle covers 92 are moved in to form a smooth surface for high-speed spinning and is left in place to prevent resist drying at the dispense nozzles 64 before the substrate chamber cover 50 is raised for substrate 58 loading and unloading.

Figure 6A:
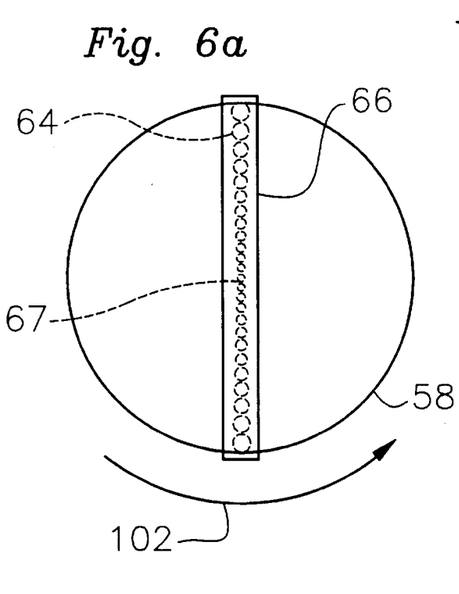
FIG. 6a is a schematic of an alternative embodiment of the spin chamber including a dispensing arm of FIG. 1b.
Figure 6B:
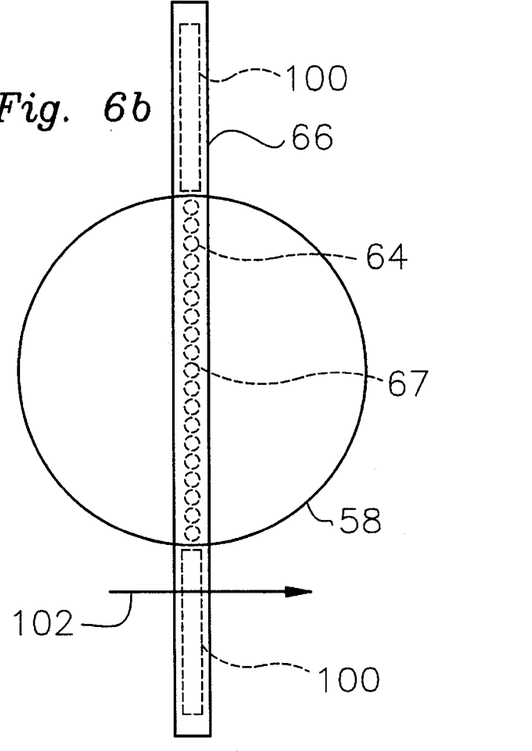
FIG. 6b is a schematic of an alternative embodiment of a scanning dispensing arm.
Figure 6C:
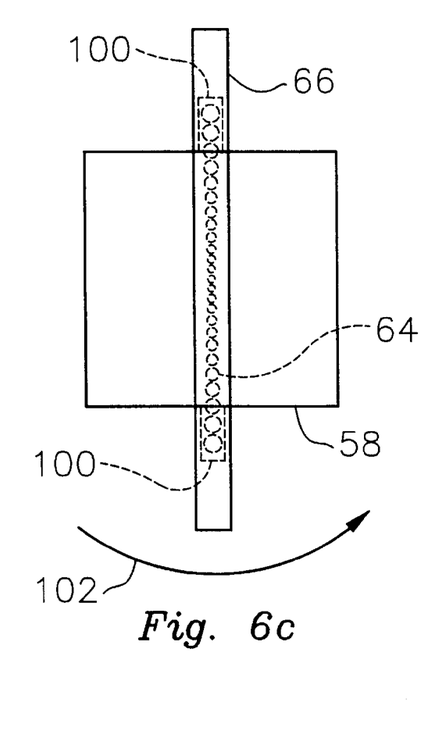
FIG. 6c is a schematic of an alternative embodiment of a rotating dispensing arm.
Figure 6D:
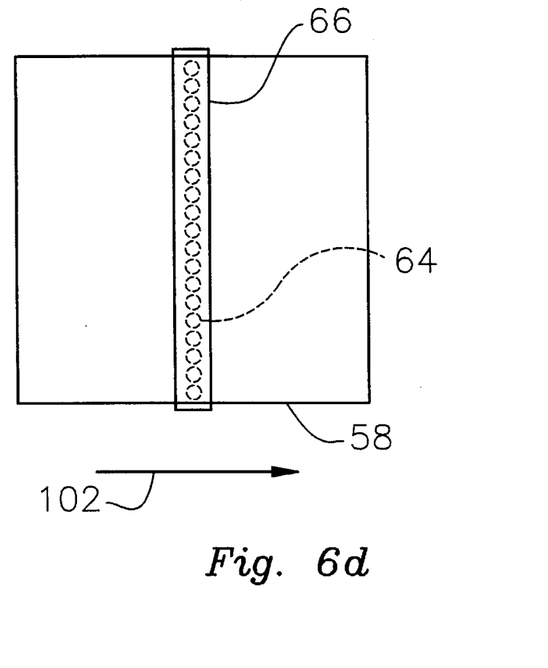
FIG. 6d is a schematic of an alternative embodiment of a scanning dispensing arm.

FIG. 6a shows the circular relative movement 102 between the dispense arm 66 and the substrate 58 during resist dispense is. In FIG. 6b, a linear movement is used. The nozzle 64 size is now uniform and the nozzle 64 closing shutters 100 move out and in gradually during the linear scan to prevent resist from dispensing outside the substrate 58 area. FIG. 6c shows combination of circular relative movement 102 and nozzle-closing shutters 100 for a rectangular substrate 58. FIG. 6d shows linear movement 102 and the absence of nozzle-closing shutters 100 for rectangular substrate 58.

Though a wafer substrate 58 is used as an example of the substrate 58 to be coated. The application of this invention is not limited to wafer substrates 58. Mask substrates, flat panel substrates, circuit boards, etc. can be uniformly coated with the techniques taught in this invention. When the uniformity requirement is not stringent, the high-speed spinning step can be omitted.

OPERATION PROCEDURE

The preferred sequence of operation for the embodiment shown in FIGS. 1l–1h is as follows:
1. Open substrate chamber cover 50.
2. Load substrate 58.
3. Close substrate chamber cover 50.
4. Retract shielding ring sections 56. (Vapor is released into the space above the substrate 58)
5. Move dispensing arm 66 into dispensing position. (More vapor is released)
6. Start substrate slow spin.
7. Dispense liquid resist.
8. Stop resist dispense.
9. Park arm.
10. Start high-speed spin.
11. Stop high-speed spin.
12. Move in shielding ring sections 56.
13. Open substrate chamber cover 50.
14. Remove substrate 58.
15. Bake substrate to dry resist.
16. Close substrate chamber cover 50.

The preferred sequence of operation for the embodiment of FIGS. 4a and 4b is as follows:
1. Open substrate chamber cover 50.
2. Load substrate 58.
3. Close substrate 58 chamber 53.
4. Retract shielding rings 56.
5. Uncover nozzles 64.
6. Start substrate slow spin.
7. Dispense liquid resist.

8. Start high-speed spin.
9. Stop high-speed spin.
10. Move in nozzle cover 82.
11. Move in shielding ring sections.
12. Open substrate chamber cover 50.
13. Remove substrate 58.
14. Bake substrate 58 to dry resist.
15. Close substrate chamber cover 50.

The sequence of operation for the embodiment of FIG. 5a–5b is similar to that of FIGS. 4a and 4b except step 10 is executed between steps 7 and 8 so that the nozzles are covered to form a smooth surface before high-speed spinning.

TYPICAL DIMENSIONS AND QUANTITIES

A circular wafer 58 of 200 mm diameter is used as an example to demonstrate typical dimension and quantities. The target resist thickness is chosen to be 1 µm as an example. With this resist thickness, the range of dispensed resist thickness before high-speed spin is 1–20 µm. A 5 µm dispensed resist thickness requires 0.16 ml of resist per 200 mm wafer. Comparing with conventional techniques requiring at least 3.5 ml of resist, a 22× saving of resist material is realized.

The nozzle 64 size is chosen to be sufficiently small so that surface tension of the liquid resist prevents it from dripping. Yet, it is chosen to be sufficiently large to facilitate nozzle 64 fabrication and to prevent too much surface tension which hinders dispensing. The usable range of nozzle 64 size is between 0.01 mm and 3 mm. Whereas, the preferred range is between 0.1 and 1 mm. The nozzles 64 are located as close as physically permitted to each other. The nozzle-to-substrate proximity distance ranges from 5 µm to 10 mm.

Preferred slow spin speed ranges from 0.1 to 100 rpm. High-speed spin ranges from 500 to 20,000 rpm. The preferred liquid resist dispense time is between 1 and 10 seconds. Using a dispense time of 3 seconds while the substrate 58 rotates at 20 rpm with the setups of FIG. 1a–h or FIG. 4, the resist flow rate is 0.53 ml/sec. With the setup of FIG. 5a–b, dispense time 3 seconds, substrate rotating at 10 rpm, a piston 86 area of 1 cm$^2$, the piston 86 speed is 0.53 mm/sec.

I claim:

1. A method of coating a substrate with a soluble material comprising the steps of
    supporting a substrate within a proximity distance of liquid dispensing nozzles in a spin chamber;
    maintaining a solvent vapor rich environment in said spin chamber;
    depositing said soluble material upon said substrate from said dispensing nozzles;
    disposing said dispensing nozzles to provide an aerodynamically non-turbulent surface; and
    spinning said substrate, such that said soluble material is distributed about said substrate.

2. A method of coating a substrate with a soluble material comprising the steps of
    supporting a substrate within a proximity distance of liquid dispensing nozzles in a spin chamber;
    maintaining a solvent vapor rich environment in said spin chamber;
    controlling the temperature of said soluble material at substantially the same temperature as said solvent vapor during a part of said coating of said substrate by maintaining a resist reservoir in fluid communication with said spin chamber;
    depositing said soluble material upon said substrate from said dispensing nozzles; and
    spinning said substrate, such that said soluble material is distributed about said substrate.

3. The method of coating a substrate with a soluble material of claim 2 further comprising the step of disposing said dispensing nozzles, to provide an aerodynamically non-turbulent surface before spinning said substrate and after depositing said soluble material.

4. The method of coating a substrate with a soluble material of claim 3 further comprising the step of retaining solvent vapor in compartments in fluid communication with said substrate, to assist in maintaining said solvent vapor rich environment.

5. The method of coating a substrate with a soluble material of claim 4 further comprising the steps of
    loading said substrate into a spin chamber;
    providing vapor for a solvent vapor rich environment in said spin chamber, before said step of supporting said substrate; and
    removing said substrate from said spin chamber after spinning said substrate.

6. The method of coating a substrate with a soluble material of claim 5 further comprising the step of spinning said substrate while depositing said soluble material.

7. The method of coating a substrate with a soluble material of claim 6 further comprising the step of baking said substrate to dry said soluble material after removing said substrate from said spin chamber.

8. An apparatus for coating a substrate with a soluble material comprising
    a spin chamber;
    a plurality of liquid dispensing nozzles in said spin chamber;
    means for providing an aerodynamically non-turbulent surface across said dispensing nozzles;
    means for supporting a substrate within a proximity distance of said dispensing nozzles;
    means for maintaining a solvent vapor rich environment in said spin chamber; and
    means for spinning said substrate, such that said soluble material is distributed about said substrate.

9. The apparatus for coating a substrate with a soluble material claim 8 further comprising means for maintaining said soluble material at substantially the same temperature as said solvent vapor.

10. The apparatus for coating a substrate with a soluble material of claim 9 further comprising means for providing an aerodynamically non-turbulent surface across said dispensing nozzles.

11. The apparatus for coating a substrate with a soluble material of claim 9 further comprising
    means for loading said substrate into a spin chamber; and
    means for removing said substrate from said spin chamber.

12. The apparatus for coating a substrate with a soluble material of claim 11 further comprising means for baking said substrate such that said soluble material dries.

* * * * *